US010020795B2

(12) United States Patent
Liu et al.

(10) Patent No.: US 10,020,795 B2
(45) Date of Patent: Jul. 10, 2018

(54) METHOD OF MANUFACTURING A COMMON MODE FILTER

(71) Applicant: SEMICONDUCTOR COMPONENTS INDUSTRIES, LLC, Phoenix, AZ (US)

(72) Inventors: Rong Liu, San Jose, CA (US); Umesh Sharma, San Jose, CA (US); Phillip Holland, Los Gatos, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/499,469

(22) Filed: Apr. 27, 2017

(65) Prior Publication Data

US 2017/0230029 A1    Aug. 10, 2017

(51) Int. Cl.

| H03H 7/42 | (2006.01) |
|---|---|
| H01F 27/29 | (2006.01) |
| H03H 3/00 | (2006.01) |
| H01F 27/28 | (2006.01) |
| H01F 41/04 | (2006.01) |
| H01L 49/02 | (2006.01) |
| H01L 29/866 | (2006.01) |

(Continued)

(52) U.S. Cl.
CPC ......... *H03H 7/427* (2013.01); *H01F 27/2804* (2013.01); *H01F 27/29* (2013.01); *H01F 41/041* (2013.01); *H01L 24/05* (2013.01); *H01L 24/48* (2013.01); *H01L 27/0248* (2013.01); *H01L 28/10* (2013.01); *H01L 29/866* (2013.01); *H03H 3/00* (2013.01); *H01L 2224/04042* (2013.01); *H01L 2224/05124* (2013.01); *H01L 2224/05139* (2013.01); *H01L 2224/05144* (2013.01); *H01L 2224/05147* (2013.01); *H01L 2224/48195* (2013.01); *H01L 2924/1206* (2013.01); *H01L 2924/12035* (2013.01)

(58) Field of Classification Search
CPC .......... H03H 7/427; H03H 7/247; H03H 3/00; H01F 27/2804; H01F 27/29; H01F 41/041; H01L 28/10; H01L 29/866; H01L 24/48

See application file for complete search history.

(56) References Cited

U.S. PATENT DOCUMENTS

| 5,392,188 A | 2/1995 | Epstein |
|---|---|---|
| 6,448,865 B1 | 9/2002 | Miller |

(Continued)

FOREIGN PATENT DOCUMENTS

WO    WO2009/001312    *    6/2008    ........... H01L 53/552

*Primary Examiner* — Zeev V Kitov
(74) *Attorney, Agent, or Firm* — Rennie William Dover

(57) ABSTRACT

A common mode filter coupled to a protection device. In accordance with an embodiment, the common mode filter has first and second coils, each coil having a spiral shape, a central region, an exterior region, a first terminal, and a second terminal, wherein the first terminal of the first coil is formed in a first portion of the central region, the first terminal of the second coil is formed in a second portion of the central region, and wherein the central region is laterally bounded by the first and second coils and the exterior region is not surrounded by the first and second coils. The protection device has a first terminal coupled to the first terminal of the first coil and a second terminal coupled to the first terminal of the second coil.

20 Claims, 13 Drawing Sheets

(51) Int. Cl.
  *H01L 23/00*  (2006.01)
  *H01L 27/02*  (2006.01)

(56) References Cited

U.S. PATENT DOCUMENTS

| | | | |
|---|---|---|---|
| 6,800,930 B2 | 10/2004 | Jackson et al. | |
| 7,692,527 B2* | 4/2010 | Ito | H01F 17/0013 |
| | | | 336/184 |
| 9,780,268 B2* | 10/2017 | Hussell | H01L 33/54 |
| 2004/0227608 A1 | 11/2004 | Nakatani et al. | |
| 2007/0138971 A1 | 6/2007 | Chen | |
| 2009/0056994 A1* | 3/2009 | Kuhr | C23C 18/1653 |
| | | | 174/259 |
| 2010/0127345 A1* | 5/2010 | Sanders | H01L 21/6835 |
| | | | 257/528 |
| 2010/0244145 A1 | 9/2010 | Saeki | |
| 2014/0266504 A1* | 9/2014 | Tai | H03H 7/427 |
| | | | 333/168 |

* cited by examiner

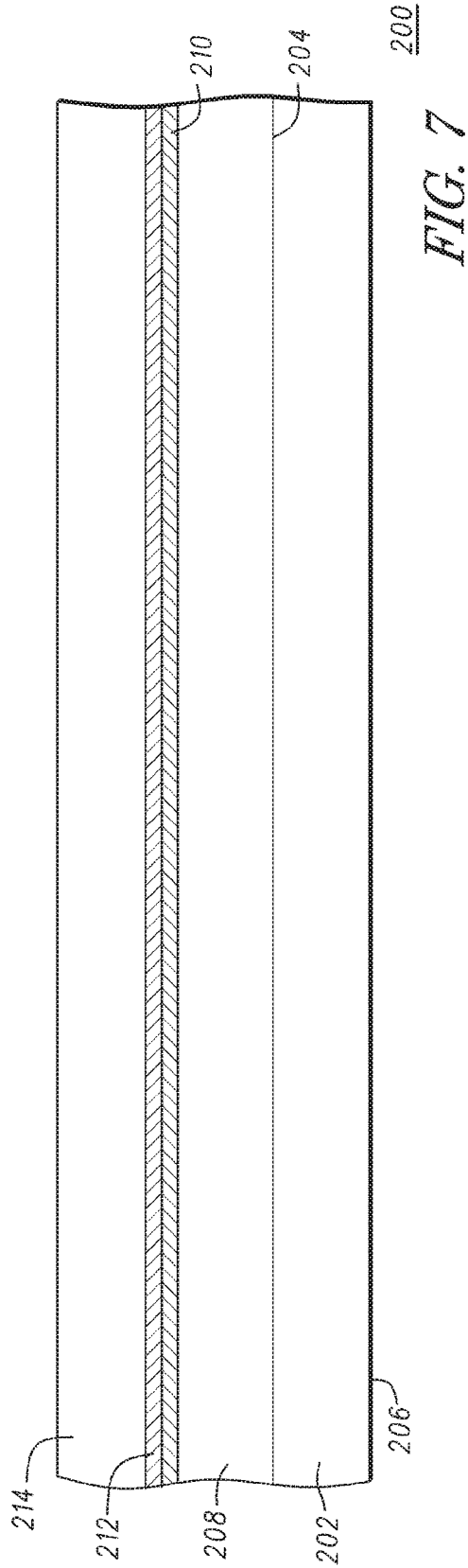
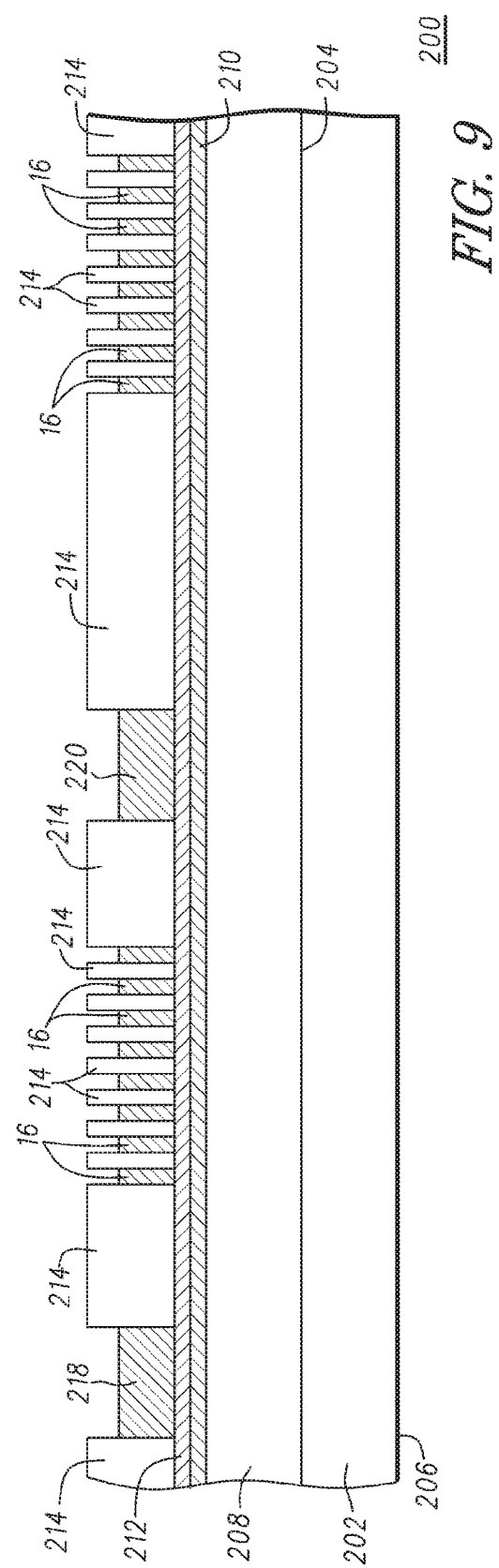

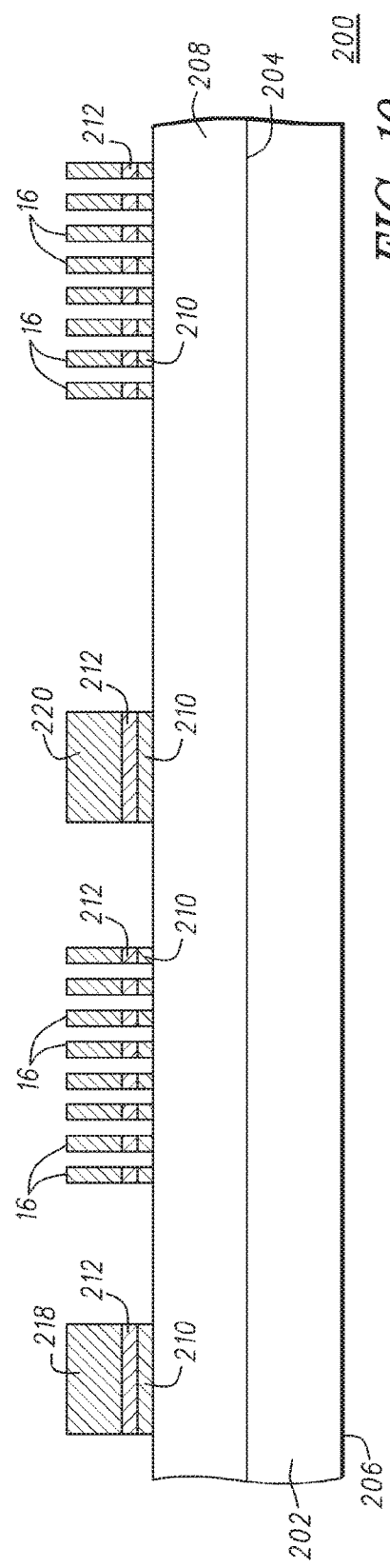
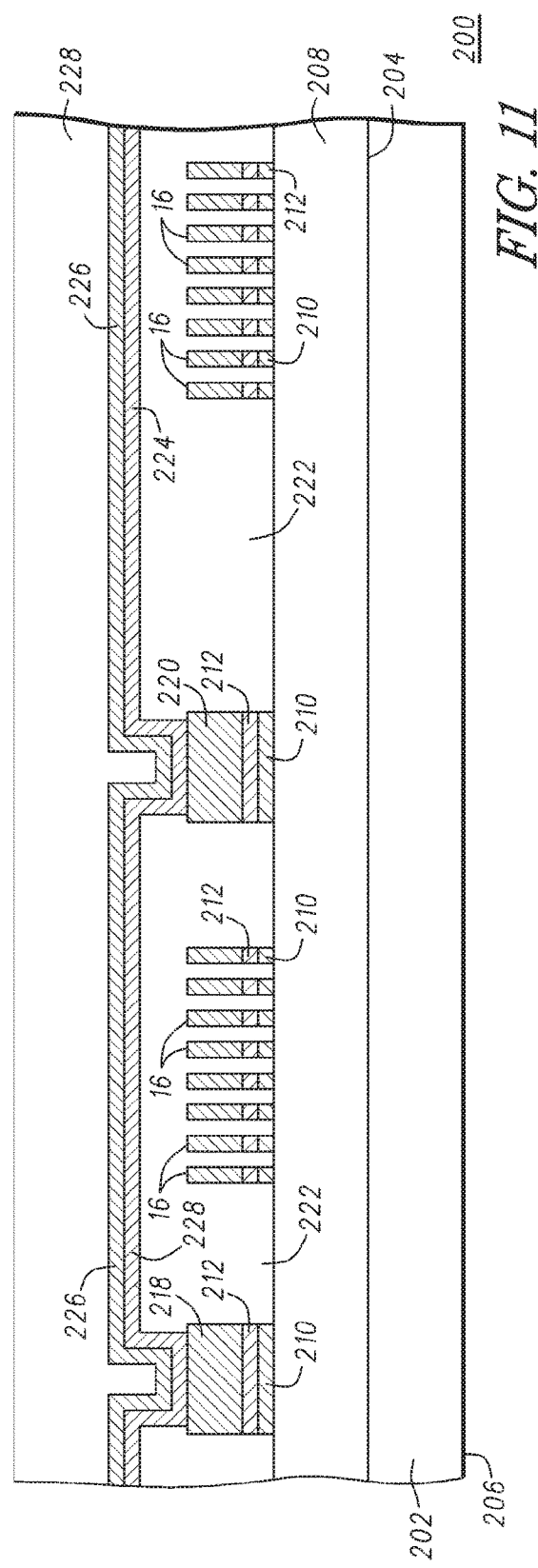

METHOD OF MANUFACTURING A COMMON MODE FILTER

TECHNICAL FIELD

The present application is a divisional application of U.S. patent application Ser. No. 14/103,508 filed on Dec. 11, 2013, by Rong Liu et al., titled "SEMICONDUCTOR COMPONENT AND METHOD OF MANUFACTURE" which is hereby incorporated by reference in its entirety, and priority thereto for common subject matter is hereby claimed.

The present invention relates, in general, to semiconductor components and, more particularly, to signal transmission in semiconductor components.

BACKGROUND

Transmission protocols within communications systems may include the use of single-ended signals, differential signals, or combinations of single-ended and differential signals. For example, single-ended signals and differential signals are suitable for use in portable communications systems that employ low speed data transmission. However, in communications systems that employ high speed data transmission, it is desirable to use differential signals because of their noise immunity properties. These types of systems include mobile electronic devices such as, for example, smartphones, tablets, computers, and systems that include Universal Serial Bus (USB) applications. In addition to noise immunity, it is desirable to include protection from large transient voltage and current spikes, which can damage these systems. Typically, noise filters, also known as Common Mode Filters (CMF), and Electro-Static Discharge (ESD) protection circuits are mounted to a Printed Circuit Board (PCB) along with other circuitry of the communications system to reduce common mode noise on differential signal lines and to suppress large transient electrical spikes, respectively. This configuration of elements occupies large area on a PCB, which is disadvantageous in mobile electronic devices.

Accordingly, it would be advantageous to have a structure and method for manufacturing a semiconductor component that provides protection from large electrical transients and provides noise filtering. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 7 is a cross-sectional view of a common mode filter at an early stage of manufacture in accordance with an embodiment of the present invention;

FIG. 9 is a cross-sectional view of the common mode filter of FIG. 7 at a later stage of manufacture;

FIG. 10 is a cross-sectional view of the common mode filter of FIG. 8 at a later stage of manufacture;

FIG. 11 is a cross-sectional view of the common mode filter of FIG. 9 at a later stage of manufacture;

Figure 1:
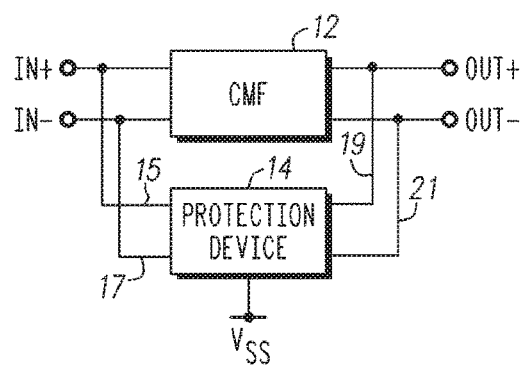
FIG. 1 is a circuit schematic of a semiconductor component comprising a common mode filter connected to a protection device in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally the present invention provides an electronic component that includes a common mode filter connected to a protection device and a method for manufacturing the semiconductor component.

In accordance with embodiments of the present invention, coils of a common mode filter can be monolithically integrated at different vertical levels using one or more thick polyimide layers, e.g., polyimide layers having thicknesses greater than about 3 micrometers (μm). The thick polyimide layer(s) reduces capacitance and keeps coils from different conductive layers from shorting together. The thick polyimide also reduces eddy currents.

FIG. 1 is a block diagram of a filter unit 10 comprising a common mode filter (CMF) 12 coupled to a protection device 14 in accordance with an embodiment of the present invention. Filter unit 10 may be referred to as a filter or a common mode filter with a protection device. In accordance with embodiments in which the protection device is an ESD structure or an ESD protection device, filter unit 10 may be referred to as a common mode filter with ESD protection or a filter with ESD protection. What is shown in FIG. 1 is common mode filter 12 having inputs IN+ and IN− that form a differential input and outputs OUT+ and OUT− that form a differential output, wherein input IN+ is connected to an input 15 of protection device 14, input IN− is connected to an input 17 of protection device 14, output OUT+ is connected to an input 19 of protection device 14, and output OUT− is connected to an input 21 of protection device 14. In addition, protection device 14 has a terminal coupled for receiving a source of operating potential such as, for example, $V_{SS}$, which may be a ground potential.

Figure 2:
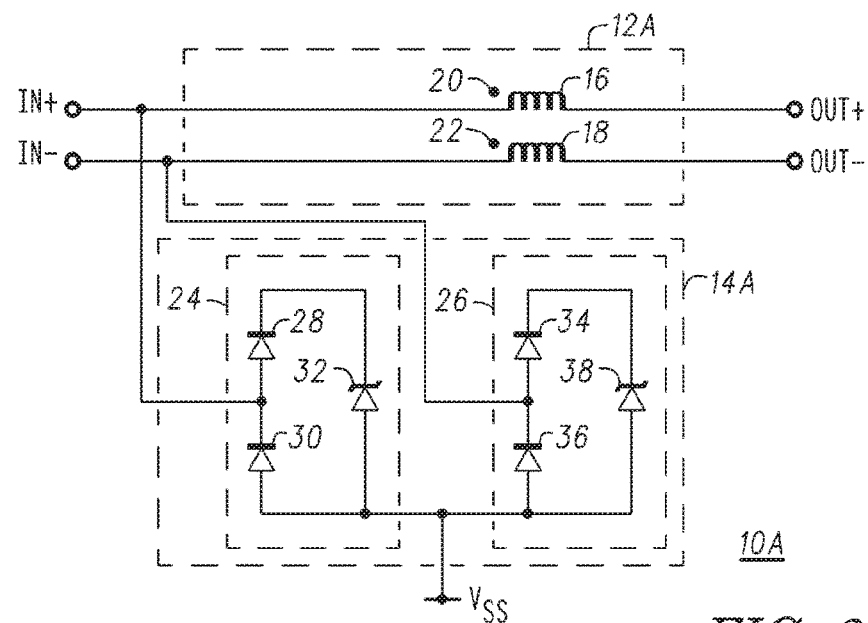
FIG. 2 is a circuit schematic of a semiconductor component comprising a common mode filter connected to a protection device in accordance with another embodiment of the present invention.

FIG. 2 is a circuit schematic of filter unit 10A comprising a common mode filter (CMF) 12A coupled to a protection device 14A in accordance with another embodiment of the present invention. It should be noted that reference character "A" has been appended to reference characters 10, 12, and 14 to distinguish between the filter unit, the common mode filter, and the protection device of FIGS. 1 and 2, respectively. Filter unit 10A may be referred to as a filter or a common mode filter with a protection device. What is shown in FIG. 2 is common mode filter 12A comprising coils 16 and 18 in a differential configuration. Coil 16 has an input IN+ and an output OUT+ that form portions of a differential input and a differential output, respectively. Coil 18 has an input IN− and an output OUT− that form portions of the differential input and a differential output, respectively. Inputs IN+ and IN− form a differential input and outputs OUT+ and OUT− form a differential output. Dots 20 and 22 indicate the magnetic coupling between coils 16 and 18. By way of example, protection device 14A includes a protection module 24 connected to input terminal IN+ of coil 16 and a protection module 26 connected to input terminal IN− of coil 18. Protection module 24 is comprised of a pair of diodes 28 and 30 and a Zener diode 32. A cathode of diode 28 is connected to a cathode of Zener diode 32 and an anode of diode 30 is connected to an anode of Zener diode 32. The anodes of diodes 30 and 32 are coupled for receiving a source of operating potential such as, for example, an operating potential $V_{SS}$. In accordance with an embodiment, operating potential $V_{SS}$ is a ground potential. The anode and cathode of diodes 28 and 30, respectively, are commonly connected together to form input 15, which is connected to input terminal IN+ of coil 16. Diodes 28 and 30 may be referred to as steering diodes, where diode 28 may be referred to as an up or top diode and diode 30 may be referred to as a down or bottom diode.

Figure 4:
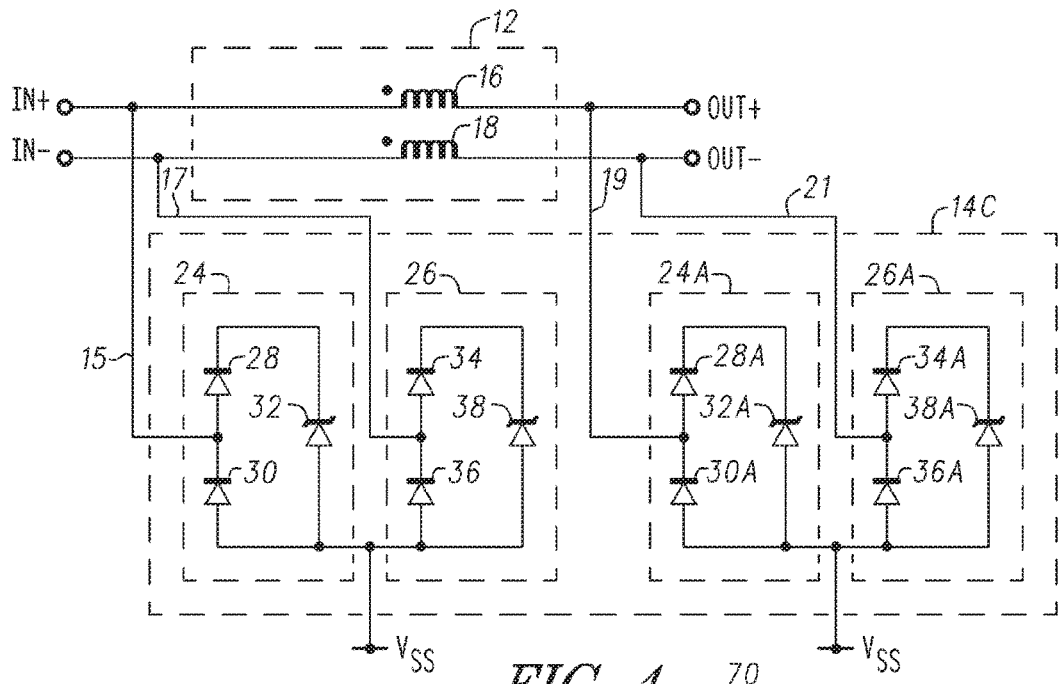
FIG. 4 is a circuit schematic of a semiconductor component comprising a common mode filter connected to a protection device in accordance with another embodiment of the present invention.

Protection module 26 is comprised of a pair of diodes 34 and 36 and a Zener diode 38. A cathode of diode 34 is connected to a cathode of Zener diode 38 and an anode of diode 36 is connected to an anode of Zener diode 38. The anodes of diodes 36 and 38 are coupled for receiving a source of operating potential such as, for example, an operating potential $V_{SS}$. The anode and cathode of diodes 34 and 36, respectively, are commonly connected together to form input 17, which is connected to input terminal IN− of coil 18. Diodes 34 and 36 may be referred to as steering diodes, where diode 34 may be referred to as an up or top diode and diode 36 may be referred to as a down or bottom diode. The configuration of protection device 14A is not limited to being comprised of a protection module 24 that includes diodes 28, 30, and 32 and protection module 26 that includes diodes 34, 36, and 38. For example, the protection modules 24 and 26 may be comprised of a Zener diode or another circuit configured to provide protection against transient voltage events. In addition, it should be noted that protection device 14A is configured to provide protection at differential inputs IN+ and IN− of a common mode filter. The protection device may be configured to provide protection at the differential outputs OUT+ and OUT− of a common mode filter, or to provide protection at the differential inputs IN+ and IN− of a common mode filter and at the differential outputs OUT+ and OUT− of the common mode filter (as shown in FIG. 4), or to provide protection at input IN+ and output OUT− of the common mode filter, or to provide protection at input IN− and output OUT− of the common mode filter, or to—provide protection at a single input, i.e., at input IN+ or input IN−, or a single output, i.e., output OUT+ or output OUT−, of the common mode filter.

Filter unit 10 or 10A may be referred to as a two die single channel device, wherein the single channel is formed from one semiconductor die or chip and protection device 14 may be formed from another semiconductor die or chip. Protection device 14 is not limited to being formed from a semiconductor die or a single semiconductor die. In addition, the number of semiconductor die from which the common mode filters are formed is not a limitation.

Figure 3:
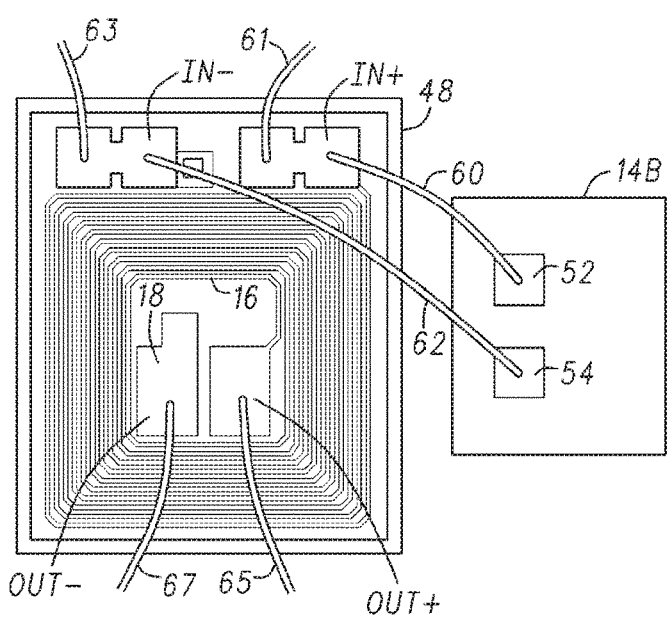
FIG. 3 is a top view of a semiconductor component comprising a common mode filter connected to a protection device in accordance with another embodiment of the present invention.

FIG. 3 is a top view of a filter unit 50 in accordance with another embodiment of the present invention. Filter unit 50 comprises coils such as, for example, coils 16 and 18 formed from a semiconductor chip 48 that are electrically connected to, for example, protection device 14B. Reference character "B" has been appended to reference character 14 for the sake of generality and to indicate that the configuration of protection device 14B may be different from the configuration of protection devices 14 and 14A. More particularly, coil 16 has an input IN+ and an output OUT+ and coil 18 has an input IN− and an output OUT−. Coils 16 and 18 may be monolithically integrated into, from, or on a semiconductor substrate. Protection device 14B has terminals or bond pads 52 and 54. In accordance with embodiments in which protection device 14B is comprised of protection modules 24 and 26 described with reference to FIG. 2, i.e., protection device 14B may be configured as protection device 14A, bond pad 52 is connected to the anode and cathode of diodes 28 and 30, respectively, and bond pad 54 is connected to the anode and cathode of diodes 34 and 36, respectively. Thus, bond pads 52 and 54 may serve as or form portions of inputs 15 and 17, respectively.

Input IN+ is electrically connected to bond pad 52 of protection device 14B through a bond wire 60 and input IN− is electrically connected to bond pad 54 through a bond wire 62. In accordance with an embodiment, protection device 14B is formed on or from a semiconductor chip that is separate from semiconductor chip 48. Protection device 14B and semiconductor chip 48 are mounted to a leadframe (not shown), which has at least two leadframe flags (not shown) and a plurality of leadframe leads (not shown), wherein the at least two leadframe flags are electrically isolated from each other and from the plurality of leadframe leads. The semiconductor chip of protection device 14B is mounted to a leadframe flag and semiconductor chip 48 is mounted to another leadframe flag. As discussed above, the leadframe flags to which protection device 14B and semiconductor chip 48 are mounted are electrically isolated from each other. Input IN+ of common mode filter 12A is electrically coupled to a leadframe lead via a bond wire 61, input IN− of common mode filter 12A is electrically coupled to a leadframe lead via a bond wire 63, output OUT+ of common mode filter 12A is electrically coupled to a leadframe lead via a bond wire 65, and output OUT− of common mode filter 12A is electrically coupled to a leadframe lead via a bond wire 67, wherein the leadframe leads are preferably separate leadframe leads from each other. In addition, the leadframe flag to which protection device 14B is mounted is electrically coupled to a source of operating potential $V_{SS}$ which may be, for example, a ground potential whereas the leadframe flag to which semiconductor chip 48 is mounted is electrically floating, i.e., not connected to a source of potential.

For the sake of completeness, a method for manufacturing coils 16 and 18 is described with reference to FIGS. 6-15.

FIG. 4 is a schematic diagram of a filter unit 70 comprising a common mode filter (CMF) 12 coupled to a protection device 14C in accordance with another embodiment of the present invention. Filter unit 70 may be referred to as a filter or a common mode filter with a protection device. In accordance with embodiments in which the protection device is an ESD structure or an ESD protection device, filter unit 70 may be referred to as a common mode filter with ESD protection or a filter with ESD protection. What is shown in FIG. 4 is common mode filter 12 having inputs IN+ and IN− that form a differential input and outputs OUT+ and OUT− that form a differential output, wherein input IN+ is connected to an input 15 of protection device 14C, input IN− is connected to an input 17 of protection device 14C, output OUT+ is connected to input 19 of protection device 14C, and output OUT− is connected to input 21 of protection device 14C. Protection device 14C includes protection modules 24 and 26 described with reference to FIG. 2 and further includes protection modules 24A and 26A. In accordance with the embodiment of FIG. 4, protection modules 24A is similar to protection module 24 and protection module 26A is similar to protection module 26. Reference character "A" has been appended to reference characters 24 and 26, and diodes 28, 30, and 32 of protection module 24 and diodes 34, 36, and 38 of protection module 26 to distinguish between the two modules. Thus, the connection configuration of diodes 28A, 30A, and 32A of protection module 24A are similar to the connection configuration of diodes 28, 30, and 32 of protection module 24 and the connection configuration of diodes 34A, 36A, and 38A of protection module 26A are similar to the connection configuration of diodes 34, 36, and 38 of protection module 26.

The configuration of protection device 14C is not limited to being comprised of a protection module 24 that includes diodes 28, 30, and 32, protection module 26 that includes diodes 34, 36, and 38, protection module 24A that includes diodes 28A, 30A, and 32A, and protection module 26 that includes diodes 34A, 36A, and 38A. For example, the protection modules 24, 24A, 26, and 26A may be comprised of a Zener diode or another circuit configured to provide protection against transient voltage events.

Figure 5:
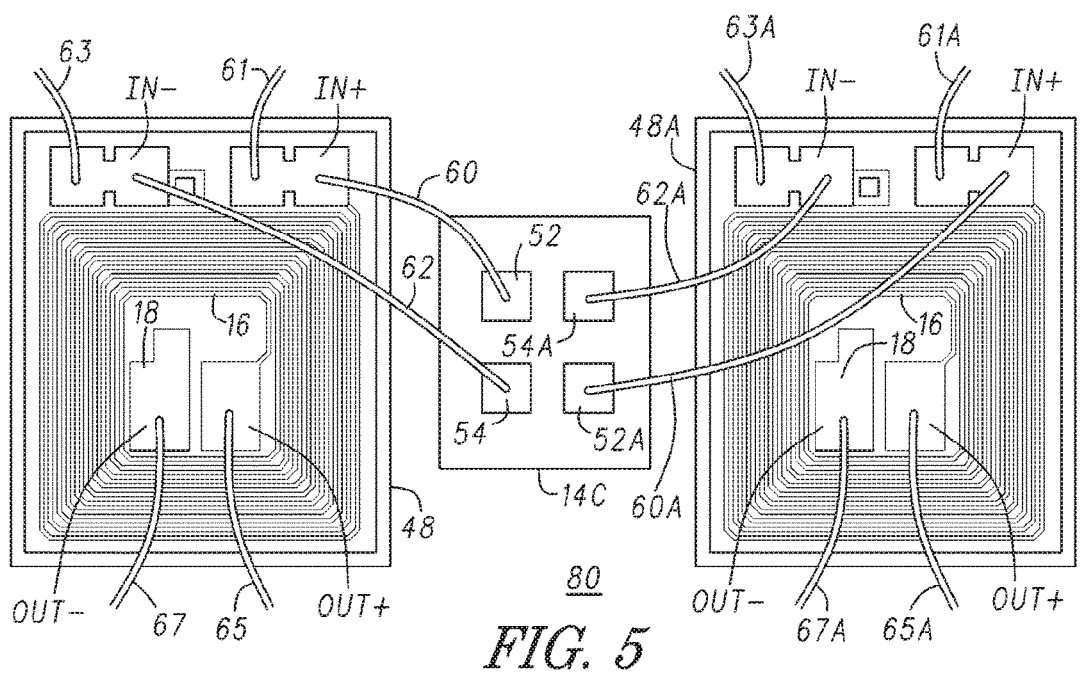
FIG. 5 is a top view of semiconductor component comprising a common mode filter connected to a protection device in accordance with another embodiment of the present invention.

FIG. 5 is a top view of a filter unit 80 comprising two pairs of coils in accordance with another embodiment of the present invention. Because filter unit 80 includes two pairs of coils it may be referred to as a two channel device. Filter unit 80 comprises coils such as, for example, coils 16 and 18 formed from semiconductor chips 48 and 48A that are electrically connected to, for example, protection device 14C. Reference character "A" has been appended to reference character 48 to distinguish the semiconductor chips and in accordance with this embodiment, the circuit configurations of semiconductors chips 48 and 48A are the same. It should be noted that the circuit configurations of semiconductor chips 48 and 48A are not limitations and that the circuit configuration of semiconductor chip 48 may be different from the circuit configuration of semiconductor chip 48A. Semiconductor chip 48 and coils 16 and 18 have been described with reference to FIG. 2. In accordance with embodiments in which protection device 14C includes protection devices that are similar to protection devices 14, 14A, 14B, protection device 14C has terminals or bond pads 52, 54, 52A, and 54A, where bond pad 52 is connected to the anode and cathode of diodes 28 and 30, respectively, bond pad 54 is connected to the anode and cathode of diodes 34 and 36, respectively, bond pad 52A is connected to the anode and cathode of diodes 28A and 30A respectively, and bond pad MA is connected to the anode and cathode of diodes 34A and 36A, respectively.

Input IN+ of semiconductor chip 48 is electrically connected to bond pad 52 of protection device 14C through a bond wire 60 and input IN− of semiconductor chip 48 is electrically connected to bond pad 54 through a bond wire 62. Input IN+ of semiconductor chip 48A is electrically connected to bond pad 52A of protection device 14C through a bond wire 60A and input IN− of semiconductor chip 48A is electrically connected to bond pad 54A through a bond wire 62A. In accordance with an embodiment, protection device 14C is formed on or from a semiconductor chip that is separate from semiconductor chips 48 and 48A. In accordance with an embodiment, semiconductor chips 48 and 48A are the same, however reference character "A" has been appended to reference character 48 to distinguish the two chips. Semiconductor chip 48 may be comprised of a common mode filter 12 and semiconductor chip 48A may be comprised of a common mode filter 12A. Protection device 14C and semiconductor chips 48 and 48A are mounted to a leadframe (not shown), which has at least three leadframe flags (not shown) and a plurality of leadframe leads (not shown), wherein the at least three leadframe flags are electrically isolated from each other and from the plurality of leadframe leads. The semiconductor chip of protection device 14C is mounted to a leadframe flag, semiconductor chip 48 is mounted to another leadframe flag, and semiconductor chip 48A is mounted to another leadframe flag. As discussed above, the leadframe flags to which protection device 14C and semiconductor chips 48 and 48A are mounted are electrically isolated from each other. Input IN+ of semiconductor chip 48 is electrically coupled to a leadframe lead via a bond wire 61, input IN− of semiconductor chip 48 is electrically coupled to a leadframe lead via a bond wire 63, output OUT+ of semiconductor chip 48 is electrically coupled to a leadframe lead via a bond wire 65, and output OUT− of semiconductor chip 48 is electrically coupled to a leadframe lead via a bond wire 67, wherein the leadframe leads are preferably separate leadframe leads from each other. Input IN+ of semiconductor chip 48A is electrically coupled to a leadframe lead via a bond wire 61A, input IN− of semiconductor chip 48A is electrically coupled to a leadframe lead via a bond wire 63A, output OUT+ of semiconductor chip 48A is electrically coupled to a leadframe lead via a bond wire 65A, and output OUT− of semiconductor chip 48A is electrically coupled to a leadframe lead via a bond wire 67A, wherein the leadframe leads are preferably separate leadframe leads from each other. In addition, the leadframe flag to which protection device 14C is mounted is electrically coupled to a source of operating potential $V_{SS}$ which may be, for example, a ground potential whereas the leadframe flag to which semiconductor chips 48 and 48A mounted are electrically floating, i.e., not connected to a source of potential.

Figure 6:
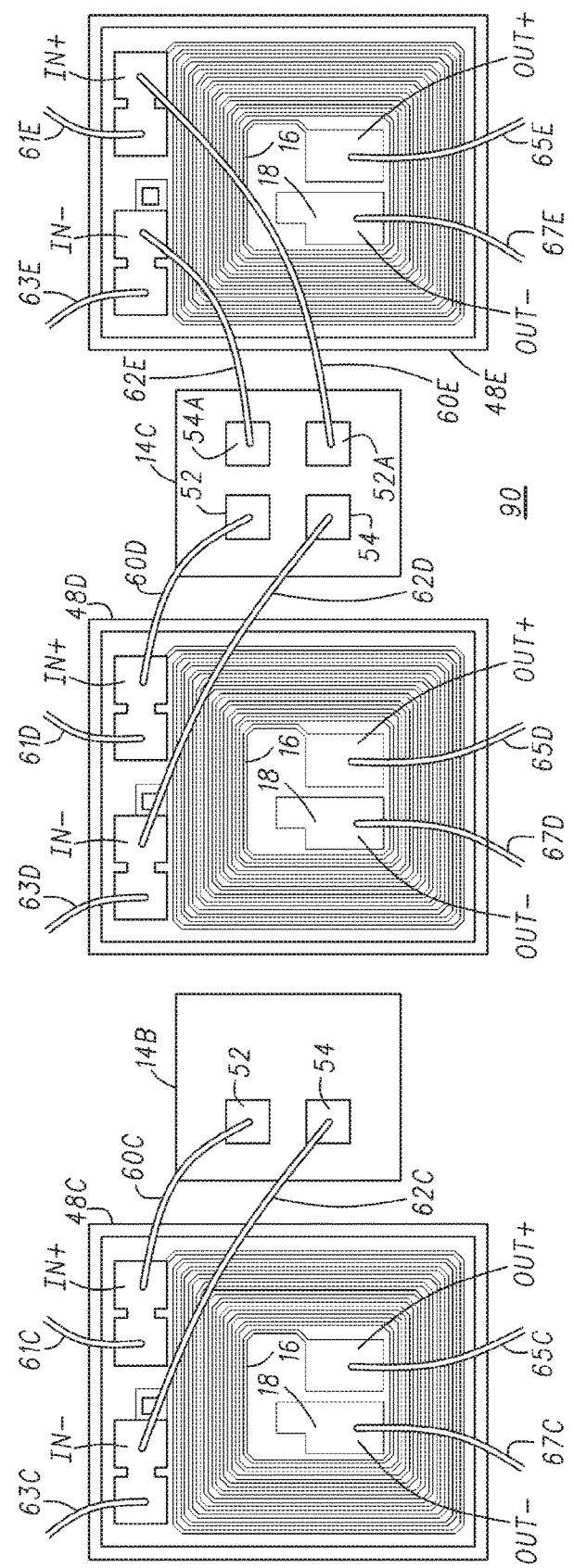
FIG. 6 is a top view of semiconductor component comprising a common mode filter connected to a protection device in accordance with another embodiment of the present invention.

FIG. 6 is a top view of a filter unit 90 comprising three pairs of coils in accordance with another embodiment of the present invention. Because filter unit 90 includes three pairs of coils it may be referred to as a three channel device. Filter unit 90 comprises coils such as, for example, coils 16 and 18 formed from semiconductor chips 48B, 48C, and 48D that are electrically connected to, for example, protection devices 14D and 14E. Reference characters "B", "C", and "D," has been appended to reference character 48 to distinguish the semiconductor chips and in accordance with this embodiment, the circuit configurations of semiconductors chips 48B, 48C, and 48D are the same as each other and as semiconductor chip 48. Protection devices 14B and 14C have been described with reference to FIGS. 3 and 5. It should be noted that the circuit configurations of semiconductor chips 48B, 48C, and 48D are not limitations and that the circuit configuration of semiconductor chips 48B, 48C, and 48D may be different from or the same as the circuit configuration of semiconductor chip 48. Semiconductor chip 48 and coils 16 and 18 have been described with reference to FIG. 2.

Input IN+ of semiconductor chip 48C is electrically connected to bond pad 52 of protection device 14B through a bond wire 60 and input IN− of semiconductor chip 48C is electrically connected to bond pad 54 through a bond wire 62. Input IN+ of semiconductor chip 48D is electrically connected to bond pad 52 of protection device 14C through a bond wire 60D and input IN− of semiconductor chip 48D is electrically connected to bond pad 54 through a bond wire 62D. Input IN+ of semiconductor chip 48E is electrically connected to bond pad 52A of protection device 14C through a bond wire 60E and input IN− of semiconductor chip 48E is electrically connected to bond pad 54A through a bond wire 62E.

In accordance with an embodiment, protection devices 14B and 14C are formed on or from semiconductor chips that are separate from each other and that are separate from semiconductor chips 48C, 48D, and 48E. In accordance with an embodiment, semiconductor chips 48C, 48D, and 48E are the same, however reference characters "C", "D", and "E" have been appended to reference character 48 to distinguish the three chips. Semiconductor chips 48C, 48D, and 48E may be comprised of a common mode filter 12. Protection devices 14B and 14C and semiconductor chips 48C, 48D, and 48E are mounted to a leadframe (not shown), which has at least five leadframe flags (not shown) and a plurality of leadframe leads (not shown), wherein the at least five leadframe flags are electrically isolated from each other and from the plurality of leadframe leads.

The semiconductor chip of protection device 14B is mounted to a leadframe flag, the semiconductor chip of protection device 14C is mounted to another leadframe flag, semiconductor chip 48C is mounted to another leadframe flag, semiconductor chip 48D is mounted to another leadframe flag, and semiconductor chip 48E is mounted to another leadframe flag. As discussed above, the leadframe flags to which protection devices 14B and 14C and semiconductor chips 48C, 48D, and 48E are mounted are electrically isolated from each other.

Input IN+ of semiconductor chip 48C is electrically coupled to a leadframe lead via a bond wire 61C, input IN− of semiconductor chip 48C is electrically coupled to a leadframe lead via a bond wire 63C, output OUT+ of semiconductor chip 48C is electrically coupled to a leadframe lead via a bond wire 65C, and output OUT− of semiconductor chip 48C is electrically coupled to a leadframe lead via a bond wire 67C, wherein the leadframe leads are preferably separate leadframe leads from each other.

Input IN+ of semiconductor chip 48D is electrically coupled to a leadframe lead via a bond wire 61D, input IN− of semiconductor chip 48D is electrically coupled to a leadframe lead via a bond wire 63D, output OUT+ of semiconductor chip 48D is electrically coupled to a leadframe lead via a bond wire 65D, and output OUT− of semiconductor chip 48D is electrically coupled to a leadframe lead via a bond wire 67D, wherein the leadframe leads are preferably separate leadframe leads from each other.

Input IN+ of semiconductor chip 48E is electrically coupled to a leadframe lead via a bond wire 61E, input IN− of semiconductor chip 48E is electrically coupled to a leadframe lead via a bond wire 63E, output OUT+ of semiconductor chip 48E is electrically coupled to a leadframe lead via a bond wire 65E, and output OUT− of semiconductor chip 48E is electrically coupled to a leadframe lead via a bond wire 67E, wherein the leadframe leads are preferably separate leadframe leads from each other. In addition, the leadframe flag to which protection devices 14B and 14C are mounted are electrically coupled to a source of operating potential $V_{SS}$ which may be, for example, a ground potential whereas the leadframe flags to which semiconductor chips 48C, 48D, and 48E are mounted are electrically floating, i.e., not connected to a source of potential or to each other.

FIG. 7 is a cross-sectional view of a portion of a semiconductor component 200 such as for example, a common mode filter during manufacture in accordance with an embodiment of the present invention. What is shown in FIG. 7 is a semiconductor material 202 having opposing surfaces 204 and 206. Surface 204 is also referred to as a front or top surface and surface 206 is also referred to as a bottom or back surface. In accordance with this embodiment, semiconductor material 202 comprises a semiconductor substrate doped with an impurity material of p-type conductivity and has a resistivity of at least about 10 Ohm-centimeter (Ω-cm). Preferably, the resistivity of substrate 202 is 100 Ω-cm. More preferably, the resistivity of substrate 202 is 500 Ω-cm or more, and even more preferably the resistivity of substrate 202 is 1,000 Ω-cm or more. Suitable materials for substrate 202 include silicon, compound semiconductor materials such as, for example, gallium nitride, gallium arsenide, indium phosphide, Group III-V semiconductor materials, Group II-VI semiconductor materials, or the like. In accordance with other embodiments, semiconductor material 202 is comprised of an epitaxial layer formed on a semiconductor substrate, where the semiconductor substrate is silicon doped with a p-type impurity material and has a resistivity of at least 100 Ω-cm and the epitaxial layer is doped with an impurity material of p-type conductivity and has a resistivity of at least 100 Ω-cm. It should be noted that a region or layer doped with an n-type dopant or impurity material is said to be of an n-type conductivity or an n conductivity type and a region or layer doped with a p-type dopant or impurity material is said to be of a p-type conductivity or a p conductivity type.

A polyimide layer 208 is formed on or from semiconductor substrate 202. By way of example, polyimide layer 208 is dispensed to have a thickness of about 16 μm and then spin coated to have a substantially planar surface and a post-cure thickness of about 10 μm. It should be noted that the thickness of polyimide layer 208 is selected to reduce parasitics, e.g., parasitic capacitances or the like between coils and contact structures. Polyimide layer 208 may be dispensed to have a thickness of about 16 μm and then spin coated to have a substantially planar surface and a post-cure thickness of at least about 4 μm. Alternatively, the post-cure thickness of polyimide layer 208 may be at least 5 μm, or at least 8 μm, or at least 10 μm. Suitable photosensitive polyimide materials include photosensitive polyimide sold under the trademark PIMEL from Asahi, HDM polymeric coatings from Hitachi Chemical and DuPont Electronics, polybenzoxazole (PBO), bisbenzocyclobutene (BCB), or the like. It should be noted that layer 208 is not limited to being a photosensitive polyimide but may be a non-photosensitive material that is patterned using photoresist.

It should be noted that in some embodiments a layer of dielectric material (not shown) such as, for example, silicon dioxide may be formed on substrate 202 and polyimide layer 208 may be formed on the layer of dielectric material.

Still referring to FIG. 7, an adhesion layer 210 having a thickness ranging from about 1,000 Å to about 3,500 Å is formed on polyimide layer 208. Suitable materials for adhesion layer 210 include titanium tungsten, titanium nitride, titanium, tungsten, platinum, or the like. A copper seed layer 212 having a thickness ranging from about 1,000 Å to about 3,500 Å is formed on adhesion layer 210. By way of example, layers 210 and 212 are each about 2,000 Å thick. A layer of photoresist 214 is formed on copper seed layer 212. Preferably, the thickness of photoresist layer 214 is selected to be thicker than the thickness of the copper to be plated in a subsequent step. By way of example, the thickness of photoresist layer 214 is about 14 μm.

Figure 8:
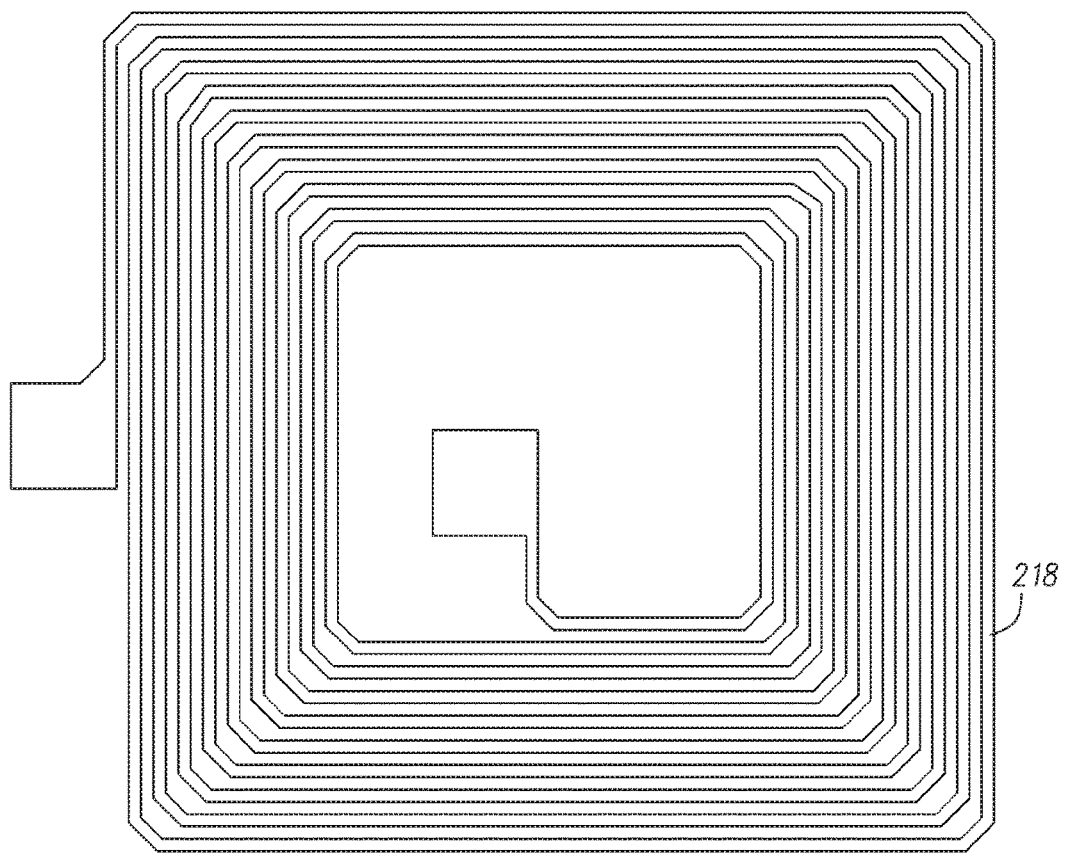
FIG. 8 is a top view of a coil pattern for use in manufacturing the common mode filter of FIGS. 1-6.

Briefly referring to FIG. 8, a mask 216 having a masking pattern 218 is illustrated for patterning photoresist layer 214. Light passes through the cross-hatched regions to expose portions of photoresist layer 214. The portions of photoresist layer 214 exposed to light are removed, exposing portions of copper seed layer 212.

Referring now to FIG. 9, after the patterning of photoresist layer 214, copper is plated onto the exposed portions of copper seed layer 244 forming contact structures 218 and 220. Plating the copper forms, for example, coils 16 and 18 of inductors described with reference to FIGS. 1-6. It should be noted that the material formed on adhesion layer 210 is not limited to being copper and may be gold, silver, aluminum, or the like. It should be further noted that an inductor comprises coils having turns, thus the coils may be referred to as an inductor or turns.

Referring now to FIG. 10, photoresist layer 214 is removed, which exposes portions of copper seed layer 212. The exposed portions of copper seed layer 212 and the portions of adhesion layer 210 under the exposed portions of copper seed layer 212 are removed using, for example, a wet etch process. It should be noted that copper seed layer 212 and adhesion layer 210 may be removed using different etching materials. Alternatively, a dry etch may be used to remove the exposed portions of layers 212 and 210.

In accordance with embodiments that include a single coil, a passivation layer may be formed over coil 16 and the exposed portions of dielectric layer 208 to form a common mode filter from a semiconductor chip. However, this is not a limitation and additional coil layers may be formed to integrate additional coils with coil 16 as described below.

Referring now to FIG. 11, a polyimide layer 222 is formed on the exposed portions of polyimide layer 208, the exposed portions of contact structures 218 and 220, and on coil 16. By way of example, polyimide layer 222 is dispensed to have a thickness of about 16 μm and then spin coated to have a substantially planar surface and a post-cure thickness of about 10 μm. It should be noted that the thickness of polyimide layer 222 is selected to reduce parasitics, e.g., parasitic capacitances or the like between coils, contact structures 218 and 220, and coil 16, and a copper layer to be plated above polyimide layer 222. By way of example, polyimide layer 222 is dispensed to have a thickness of about 16 μm and then spin coated to have a substantially planar surface and a post-cure thickness of at least about 4 μm. Alternatively, the post-cure thickness of polyimide layer 222 may be at least 5 μm, or at least 8 μm, or at least 10 μm. Suitable photosensitive polyimide materials include photosensitive polyimide sold under the trademark PIMEL from Asahi, HDM polymeric coatings from Hitachi Chemical and DuPont Electronics, polybenzoxazole (PBO), bisbenzocyclobutene (BCB), or the like. It should be noted that layer 222 is not limited to being a photosensitive polyimide but may be a non-photosensitive material that is patterned using photoresist.

Portions of polyimide layer 222 above the portions of contact structures 218 and 220 are removed by exposure to electromagnetic radiation followed by a develop step. Polyimide layer 222 is cured after removal of the portions exposed to the electromagnetic radiation. Removal of the exposed portions of polyimide layer 222 exposes portions of contact structures 218 and 220.

Still referring to FIG. 11, an adhesion layer 224 having a thickness ranging from about 1,000 Å to about 3,500 Å is formed on polyimide layer 222 and on the exposed portions of contact structures 218 and 220. Suitable materials for adhesion layer 224 include titanium tungsten, titanium nitride, titanium, tungsten, platinum, or the like. A copper seed layer 226 having a thickness ranging from about 1,000 Å to about 3,500 Å is formed on adhesion layer 224. A layer of photoresist 228 is formed on copper seed layer 226. Preferably, the thickness of photoresist layer 228 is selected to be greater than the thickness of a copper layer to be plated on copper seed layer 226. The material formed on adhesion layer 224 is not limited to being copper and may be gold, silver, aluminum, or the like. The thickness of photoresist layer 228 may range from about 5 μm to about 20 μm and may be, for example, about 14 μm. As those skilled in the art will appreciate, the thickness of photoresist layer 228 may be process limited because of line width definition limitations.

Figure 12:
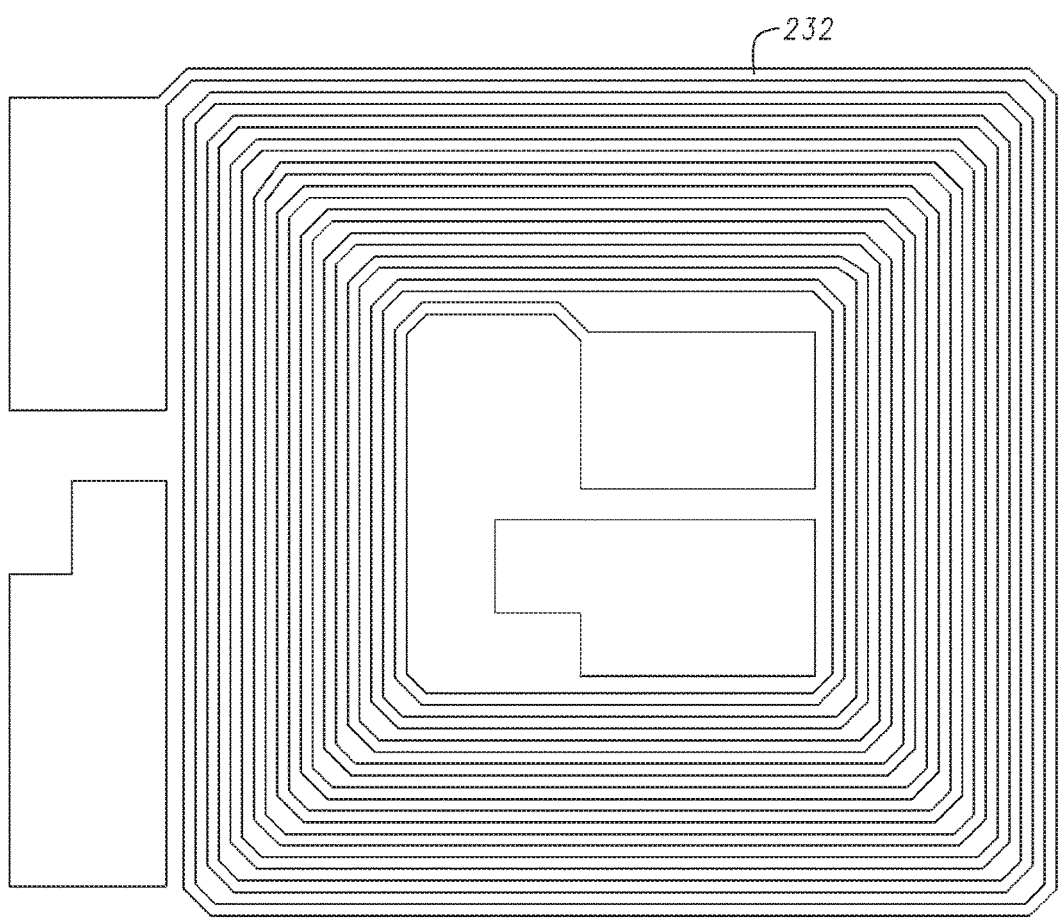
FIG. 12 is a top view of a coil pattern for use in manufacturing the common mode filter of FIG. 11.

Briefly referring to FIG. 12, a mask 230 having a masking pattern 232 is illustrated for patterning photoresist layer 228. Light passes through the cross-hatched regions to expose portions of photoresist layer 228. The portions of photoresist layer 228 exposed to light are removed, exposing portions of copper seed layer 226.

Figure 13:
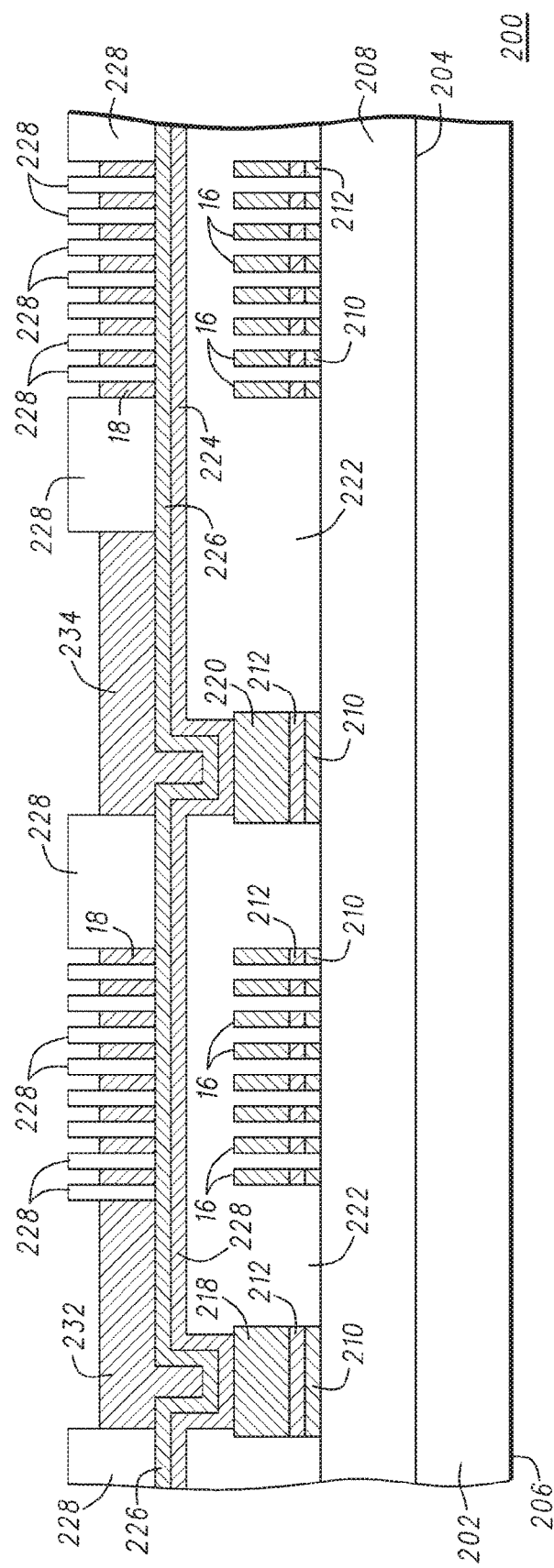
FIG. 13 is a cross-sectional view of the common mode filter of FIG. 11 at a later stage of manufacture.

Referring now to FIG. 13, after patterning photoresist layer 228, copper is plated onto the exposed portions of copper seed layer 226 forming a contact structure 232 that has a surface 246 and that extends from contact structure 218, forming a contact structure 234 having a surface 248 and that extends from contact 220, and forming coil 18 of an inductor such as the inductors shown in FIGS. 1-6.

Figure 14:
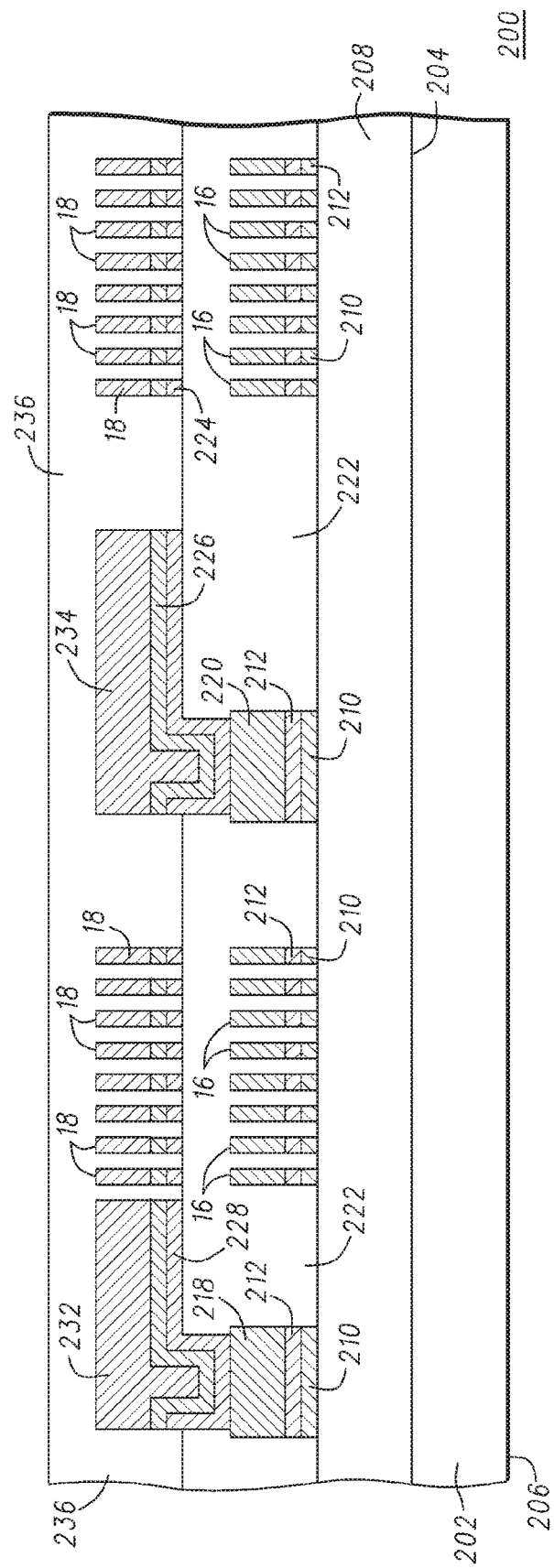
FIG. 14 is a cross-sectional view of the common mode filter of FIG. 13 at a later stage of manufacture.

Referring now to FIG. 14, photoresist layer 228 is removed, which exposes portions of copper seed layer 226. The exposed portions of copper seed layer 226 and the portions of adhesion layer 224 under the exposed portions of copper seed layer 226 are removed using, for example, a wet etch process. A polyimide layer 236 is formed on the exposed portions of polyimide layer 222, the exposed portions of contact structures 232 and 234, and on coil 18. By way of example, polyimide layer 236 is dispensed to have a thickness of about 16 µm and then spin coated to form a substantially planar surface. It should be noted that after curing, the thickness of polyimide layer 236 is at least about 5 µm and may be about 10 µm. The thickness of polyimide layer 236 is selected to reduce parasitics, e.g., parasitic capacitances between coils contact structures 232 and 234, and coil 18, and a copper layer to be plated above polyimide layer 236. Suitable photosensitive polyimide materials have been described with reference to polyimide layer 222.

Figure 15:
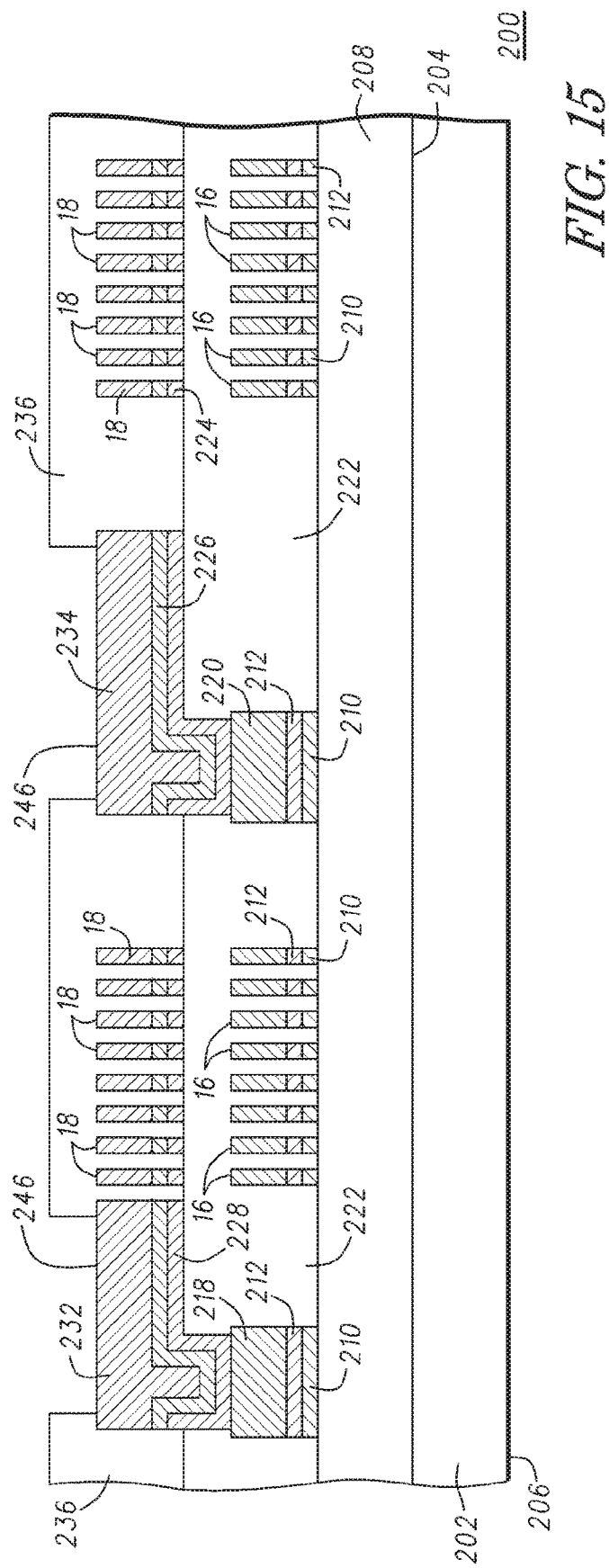
FIG. 15 is a cross-sectional view of the common mode filter of FIG. 14 at a later stage of manufacture.

Referring now to FIG. 15, portions of polyimide layer 236 above the portions of contact structures 232 and 234 are removed by exposure to electromagnetic radiation followed by a develop step. Polyimide layer 236 is cured after removal of the portions exposed to the electromagnetic radiation. Removal of the exposed portions of polyimide layer 236 exposes portions of surfaces 246 and 248 of contact structures 232 and 234, respectively.

Figure 16:
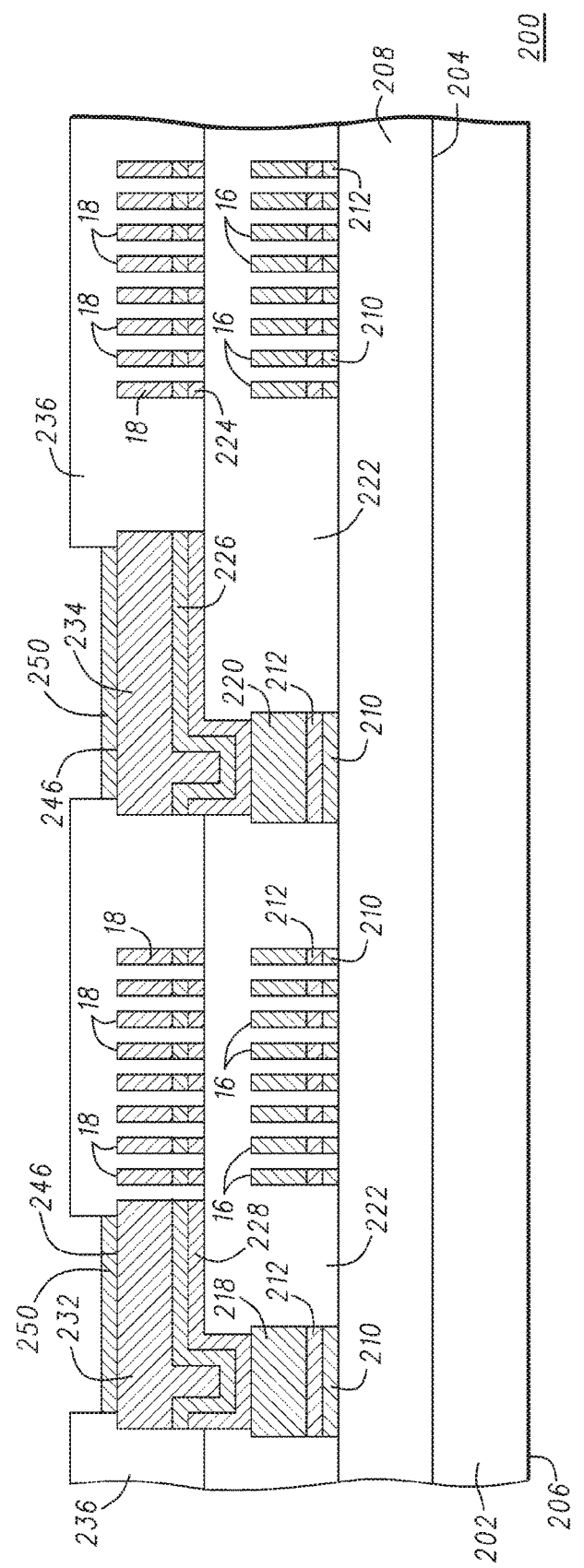
FIG. 16 is a cross-sectional view of the common mode filter of FIG. 15 at a later stage of manufacture.

Referring now to FIG. 16, protective layers 250 and 252 having a thickness ranging from about 1 µm to about 5 µm is formed over surfaces 246 and 248 of contact structures 232 and 234, respectively, in embodiments in which the electrically conductive material of contact structures 232 or 234 may become oxidized. For example, in embodiments in which the electrically conductive material of contact structures 232 and 234 is copper, protective layers 250 and 252 may be layers of nickel-gold. Alternatively, protective layers 250 and 252 may be nickel, palladium, aluminum, or the like.

Figure 17:
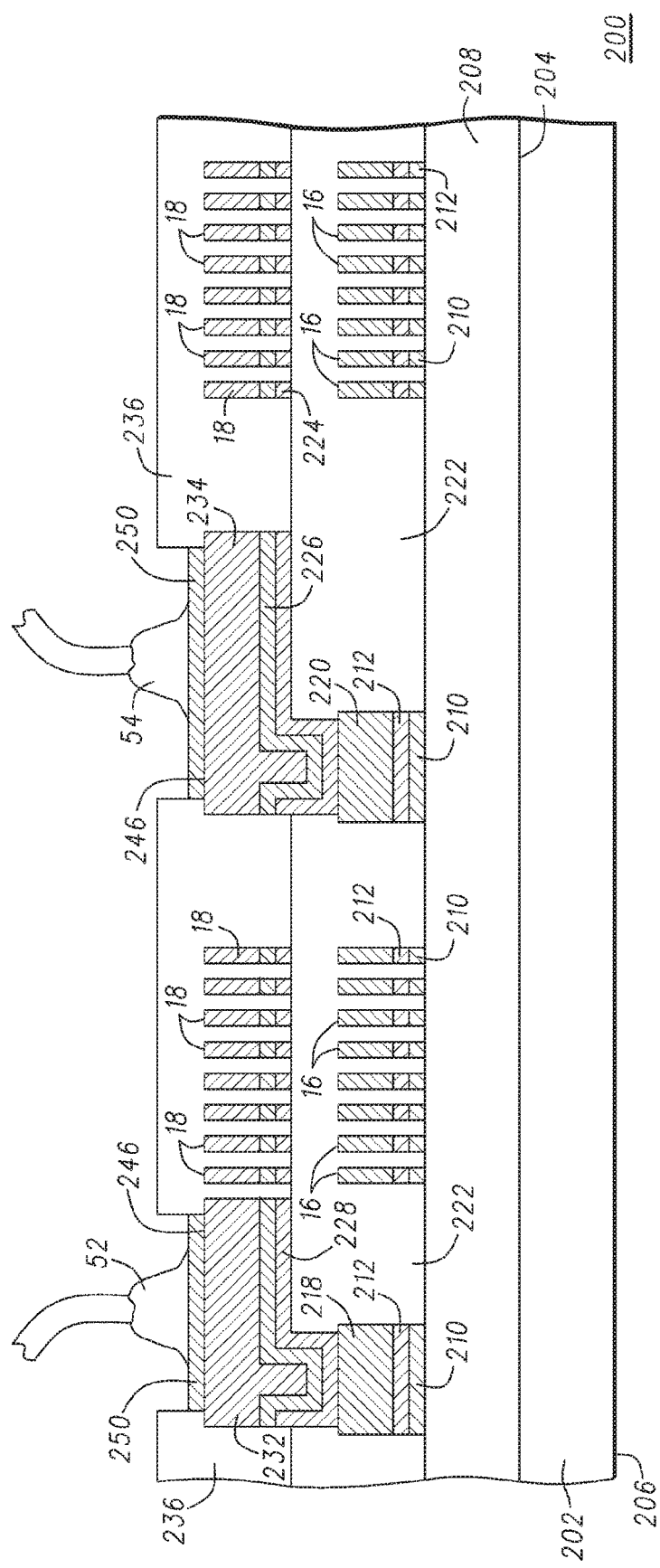
FIG. 17 is a cross-sectional view of the common mode filter of FIG. 15 at a later stage of manufacture.

Referring now to FIG. 17, bond wires are formed to contact protective layers 250. By way of example, contact structure 232 and protective layer 250 form terminal 52 of FIGS. 3, 5, and 6 and contact structure 234 and protective layer 252 form contact 54 of FIGS. 3, 5, and 6. In accordance with this example, the bond wire in contact with terminal 52 is bond wire 60 and the bond wire in contact with terminal 54 is bond wire 62.

In accordance with embodiments of the present invention, the conductive layers forming the coils or spiral traces of the common mode filter have thicknesses ranging from less than about 0.1 micrometer (µm) to about 14 micrometers and the lateral spacing between the spiral traces ranges from less than about 0.1 micrometer (µm) to about 14 micrometers. In some embodiments, the thicknesses and lateral spacing ranges from about 5 µm to about 8 µm.

Figure 18:
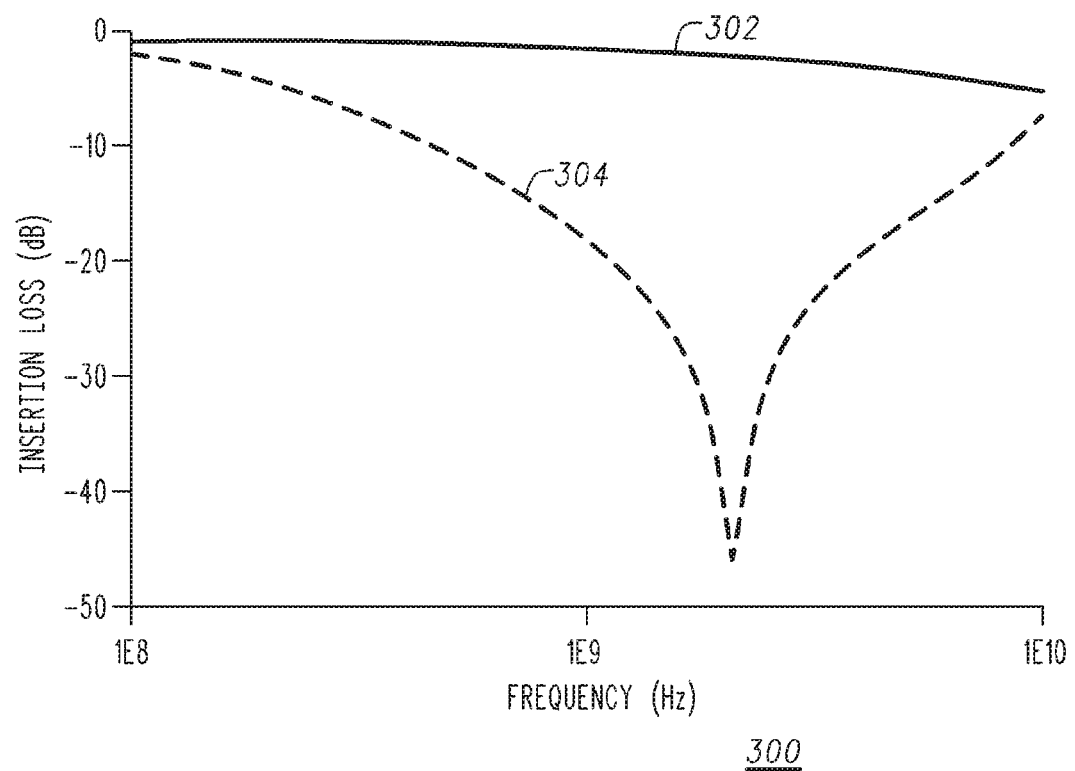
FIG. 18 is a frequency response plot of a common mode filter in accordance with embodiments of the present invention.

FIG. 18 is a frequency response plot 300 of semiconductor components such as filter units 10, 10A, 50, 70, 80, and 90 in accordance with embodiments of the present invention. More particularly, frequency response plot 300 illustrates the differential mode transmission frequency response plot 302 and the common mode transmission frequency response plot 304 of filter units configured and manufactured in accordance with embodiments of the present invention. Plot 302 illustrates that the differential signal passes through the filter unit without a significant amount of attenuation, i.e., plot 302 is substantially flat and low loss, where the cutoff frequency from its attenuation at the minus 3 dB point is between 6 GigaHertz (GHz) and 7 GHz. Plot 304 illustrates the amount of common mode noise the filter units can suppress. It is desirable for the frequency range for the common mode filter to be wide and the attenuation to be high. Plot 304 shows that that there is −10 dB or more attenuation from about 450 MegaHertz (MHz) to about 8.5 GHz, which indicates strong attenuation over a wide frequency range.

By now it should be appreciated that an electronic component that includes a CMF connected to an ESD protection device and methods for manufacturing the electronic component have been provided. Advantages include small outline, low profile, single package solution which combines a CMF with an ESD protection device; good CMF performance; a differential bandwidth up to at least 6 GHz; a nominal common mode rejection of −15 dB at 500 MegaHertz; a cost effective solution. In addition bonding can be made to contacts surrounded by a coil saving die area or bonding can be made to contacts laterally adjacent the coil.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing an electronic component, comprising:

forming a common mode filter from a first semiconductor chip, the common mode filter having a first channel and comprising first and second coils configured to provide a lateral boundary of a first central region, the first coil having a spiral shaped portion and first and second terminals, the first terminal in a first portion of the first central region and the second terminal in a first portion of a first non-central region; the second coil having a spiral shaped portion and first and second terminals, the first terminal of the second coil in a second portion of the first central region and the second terminal of the second coil in a second portion of the first non-central region, wherein the first non-central region is outside the spiral shape of the first and second coils;

forming a protection structure from a second semiconductor chip, the protection structure having a plurality of bond pads;

electrically coupling the second terminal of the first coil to a first bond pad of the plurality of bond pads; and electrically coupling the second terminal of the second coil to a second bond pad of the plurality of bond pads.

2. The method of claim 1, further including forming a second common mode filter from a third semiconductor chip which includes forming the second common mode filter having a second channel and comprising third and fourth coils configured to provide a lateral boundary of a second central region, the third coil having a spiral shaped portion and first and second terminals, the first terminal of the third coil in a first portion of the second central region and the second terminal of the third coil in a first portion of a second non-central region; the fourth coil having a spiral shaped portion and first and second terminals, the first terminal of the fourth coil in a second portion of the second central region and the second terminal of the fourth coil in a second portion of the second non-central region, wherein the second non-central region is outside the spiral shape of the third and fourth coils;

electrically coupling the second terminal of the third coil to a third bond pad of the plurality of bond pads; and electrically coupling the second terminal of the fourth coil to a fourth bond pad of the plurality of bond pads.

3. The method of claim 1, further including forming the first and second bond pads from an electrically conductive material selected from the group of electrically conductive materials comprising copper, silver, gold, and aluminum.

4. The method of claim 1, wherein electrically coupling the second terminal of the second coil to the first bond pad of the plurality of bond pads comprises directly bonding a first bond wire to the electrically conductive material of the first bond pad and wherein electrically coupling the second terminal of the second coil to the second bond pad of the plurality of bond pads comprises directly bonding a second bond wire to the electrically conductive material of the second bond pad.

5. The method of claim 1, further including forming the spiral shaped portion of the first coil to be laterally adjacent the spiral shaped portion of the second coil, wherein a first lateral distance between the spiral shaped portion of the first coil and the spiral shaped portion of the second coil element ranges from less than about 0.1 micrometers to about 14 micrometers, and wherein a thickness of the first and second coil elements ranges from less than about 0.1 micrometers to about 14 micrometers.

6. The method of claim 5, further including forming the spiral shaped portion of the first coil to be laterally adjacent the spiral shaped portion of the second coil, wherein a first lateral distance between the spiral shaped portion of the first coil and the spiral shaped portion of the second coil element ranges from less than about 5 micrometers to about 8 micrometers, and wherein a thickness of the first and second coil elements ranges from about 5 micrometers to about 8 micrometers.

7. A method for manufacturing an electronic component, comprising:

providing a first semiconductor material having a major surface, the first semiconductor material from a first semiconductor chip;

forming a first layer of dielectric material over the semiconductor material;

forming a common mode filter over the first layer of dielectric material, the common mode filter having an interior portion and an exterior portion, wherein forming the common mode filter includes:

forming a first coil of the common mode filter over a first portion of the first dielectric layer, the first coil having a first terminal coupled to a second terminal by a first spiral-shaped portion, the first terminal of the first coil in a first portion of the inner region of the common mode filter;

forming a second layer of dielectric material over the first coil and the first layer of dielectric material;

forming a second coil of the common mode filter over a first portion of the second dielectric layer, the second coil having a first terminal coupled to a second terminal by a second spiral shaped portion, the first terminal of the second coil in a second portion of the inner region of the common mode filter;

forming a protection structure from a second semiconductor material having a plurality of bond pads, the second semiconductor material from a second semiconductor chip;

electrically coupling the second terminal of the first coil to a first bond pad of the plurality of bond pads; and electrically coupling the second terminal of the second coil to a second bond pad of the plurality of bond pads.

8. The method of claim 7, wherein forming the first layer of dielectric material comprises forming a first polyimide layer on the semiconductor material.

9. The method of claim 8, wherein forming the first coil of the common mode filter over the first portion of the first dielectric layer comprises forming a first electrically conductive material over the first polyimide layer and patterning the first electrically conductive material to be the first coil.

10. The method of claim 8, wherein forming the first electrically conductive material includes forming an adhesion layer on the semiconductor material and forming a seed layer on the adhesion layer.

11. The method of claim 10, wherein patterning the first electrically conductive material comprises:

forming a layer of photoresist on the first electrically conductive material; and removing portions of the layer of photoresist to form a spiral shaped pattern that exposes the first electrically conductive material.

12. The method of claim 11, further including plating copper on the seed layer to form a first contact structure, a second contact structure, and the first coil having the first terminal coupled to the second terminal by the second spiral shaped portion, wherein the first contact structure serves as the first terminal of the first coil.

13. The method of claim 11, further including forming the second layer of dielectric material over the first coil and the first layer of dielectric material includes forming a second polyimide layer over the first coil, the first contact structure, and the second contact structure, and over the first layer of dielectric material.

14. The method of 13, further including removing portions of the second polyimide layer to expose first and second contact structures.

15. The method of claim 14, further including forming a second electrically conductive material over the second layer of dielectric material, wherein a first portion of the second electrically conductive material contacts the first electrical contact and a second portion of the second electrically conductive material contacts the second electrical contact.

16. The method of claim 15, wherein forming a second layer of dielectric material over the first coil and the first layer of dielectric material includes:

forming another layer of photoresist on the second electrically conductive material;

removing portions of the another layer of photoresist to form a spiral pattern that exposes the second electrically conductive material; and plating additional copper on the second electrically conductive material to form a third contact structure, a fourth contact structure, and the second coil having the first end coupled to the second end by the second spiral shaped portion.

17. A method for manufacturing an electronic component, comprising:

providing a first semiconductor chip having a first monolithically integrated common mode filter having a central region and an exterior region, the first monolithically integrated common mode filter comprising a first coil having a first terminal, a second terminal, and a spiral shaped portion between the first terminal and the second terminal of the first coil; and a second coil having a first terminal, a second terminal and a spiral shaped portion between the first terminal and the second terminal of the second coil, wherein the first terminals of the first and second coils formed in the central region of the first monolithically integrated common mode filter and the second terminals of the first and second coils in the exterior region of the first monolithically integrated common mode filter;

positioning a second semiconductor chip adjacent to the first semiconductor chip, the second semiconductor chip including a first protection device having a first terminal and a second terminal;

electrically coupling the first terminal of the first protection device to the first terminal of the first coil; and electrically coupling the second terminal of the first protection device to the first terminal of the second coil.

18. The method of claim 17, further including electrically coupling the first terminal of the first protection device to the first terminal of the first coil by a first bond wire and electrically coupling the second terminal of the first protection device to the first terminal of the second coil by a second bond wire.

19. The method of claim 18, wherein the second semiconductor chip further includes a second protection device having a first terminal and a second terminal.

20. The method of claim 19, further including providing a third semiconductor chip having a second monolithically integrated common mode filter having a central region and an exterior region, the second monolithically integrated common mode filter comprising a third coil having a first terminal, a second terminal, and a spiral shaped portion between the first terminal and the second terminal of the third coil; and a fourth coil having a first terminal, a second terminal and a spiral shaped portion between the first terminal and the second terminal of the fourth coil, wherein the first terminals of the third and fourth coils are formed in the central region of the second monolithically integrated common mode filter and the second terminals of the third and fourth coils are formed in the exterior region of the second monolithically integrated common mode filter and further including coupling the first terminal of the third coil to the first terminal of the second protection device with a bond wire and electrically coupling the second terminal of the third coil to the second terminal of the second protection device.

\* \* \* \* \*